United States Patent [19]
Pascucci

[11] Patent Number: 5,889,710
[45] Date of Patent: Mar. 30, 1999

[54] SEMICONDUCTOR MEMORY DEVICE WITH ROW REDUNDANCY

[75] Inventor: Luigi Pascucci, Sesto San Giovanni, Italy

[73] Assignee: SGS-Thomson Microelectronics S.r.L., Agrate Brianza, Italy

[21] Appl. No.: 842,835

[22] Filed: Apr. 17, 1997

[30] Foreign Application Priority Data

Apr. 18, 1996 [EP] European Pat. Off. .............. 96830217

[51] Int. Cl.$^6$ ...................................................... G11C 7/00
[52] U.S. Cl. .............. 365/200; 365/185.22; 365/189.01; 365/233.5
[58] Field of Search ................................... 365/200, 201, 365/185.22, 230.06, 233.5, 189.01

[56] References Cited

U.S. PATENT DOCUMENTS

| | | | |
|---|---|---|---|
| 4,811,298 | 3/1989 | Helwig et al. ............................ | 365/100 |
| 4,849,938 | 7/1989 | Furutani et al. ........................ | 371/10.3 |
| 4,858,192 | 8/1989 | Tatsumi et al. .......................... | 365/200 |

FOREIGN PATENT DOCUMENTS

0 668 563   8/1995   European Pat. Off. ........ G06F 11/20

*Primary Examiner*—David Nelms
*Assistant Examiner*—Hoai V. Ho
*Attorney, Agent, or Firm*—Wolf, Greenfield & Sacks, P.C.

[57] ABSTRACT

A semiconductor memory device includes: a matrix of memory cells including a plurality of rows of memory cells; first means for generating a first internal timing signal activated upon changing of a current address supplied to the memory device, the first timing signal remaining activated for a prescribed time substantially at the beginning of a read cycle of the memory device; row address decoding means supplied by the current address for selecting a row of memory cells; second means for storing defective addresses of defective rows in the matrix of memory cells, for comparing the defective addresses with a current address supplied to the memory device, for selecting a redundancy row when the current address coincides with one of the defective addresses and for correspondingly deactivating the row address decoding means to prevent the selection of the defective row. The memory device includes redundancy control means supplied by the first timing signal, the redundancy control means enabling said row address decoder means at the beginning of the read cycle independently of the current address and maintains the row address decoder means enabled until the first timing signal is deactivated.

21 Claims, 6 Drawing Sheets

SEMICONDUCTOR MEMORY DEVICE WITH ROW REDUNDANCY

BRIEF DESCRIPTION OF THE DRAWINGS

1. Field of the Invention

The present invention relates to a semiconductor memory device with row redundancy.

2. Discussion of the Related Art

In semiconductor memory devices redundancy memory elements are conventionally provided to functionally replace defective memory elements: for example, since semiconductor memory devices comprise a matrix of memory cells arranged in rows (word lines) and columns (bit lines), redundancy word lines and/or redundancy bit lines are provided to functionally replace defective word lines and/or defective bit lines, respectively.

If redundancy memory elements are provided, a redundancy circuit must be provided for storing the addresses of the defective memory elements (defective addresses), comparing the stored defective addresses with a current address supplied to the memory device, preventing the activation of the addressed defective memory element and activating in substitution a redundancy memory element.

In asynchronous memory devices, such as for example EPROMs, EEPROMs and Flash EEPROMs, for which no external timing signals (such as strobe signals) are provided, it is convenient to generate an internal timing signal to provide a time basis for the read operation: the access to the matrix memory element is triggered by a change in the address configuration supplied to the memory device; an internal timing signal (Address Transition Detection or ATD) is generated when such a change in the address configuration is detected, and the ATD signal provides the timing of the read operation: for example, the ATD signal is used to preset the sensing circuits.

The activation of redundancy memory elements follows a path which is parallel to that leading to the selection of the matrix memory elements, and the redundancy element selection path is asynchronous, i.e. not synchronized with the internal timing signal. As soon as the redundancy circuit recognizes that the current address is a defective address, it inhibits the activation of the defective memory element by disabling the address decoder and enables the selection of the redundancy memory element.

The problem arises when, after a defective word line has been addressed, a non-defective word line is successively addressed: since in the preceding read cycle the row address decoder has been disabled, it is impossible to start the selection of the non-defective word line until the redundancy circuit recognizes that the new address is not a defective address; this time delay causes a lengthening of the access time of the memory device.

In view of the state of the art described, it is an object of the present invention to provide a semiconductor memory device with a novel row redundancy architecture suitable to overcome the above-mentioned problem.

SUMMARY OF THE INVENTION

According to the present invention, these and other objects are attained by means of a semiconductor memory device comprising:

a matrix of memory cells comprising a plurality of rows of memory cells;

first means for generating a first internal timing signal activated upon changing of a current address supplied to the memory device, the first timing signal remaining activated for a prescribed time starting from the beginning of a read cycle of the memory device;

row address decoding means supplied by the current address for selecting a row of memory cells;

second means for storing defective addresses of defective rows in said matrix of memory cells, for comparing said defective addresses with a current address supplied to the memory device, for selecting a redundancy row when the current address coincides with one of said defective addresses and for correspondingly deactivating the row address decoding means to prevent the selection of the defective row; and redundancy control means supplied by the first timing signal, the redundancy control means enabling said row address decoder means at the beginning of the read cycle independently of the current address and maintaining the row address decoder means enabled until the first timing signal is deactivated.

Thanks to the present invention, at the beginning of each read cycle of the memory device the row address decoder is forcedly enabled independently of the current address supplied to the memory device. In this way, if previously a redundancy row were selected and the new address corresponds to a non-defective row, it is not necessary to wait for the activation of the row address decoder after the new address has been recognized as non-defective: the row address decoder is always activated at the beginning of each read cycle. If the new address is a defective address, the row address decoder will be deactivated only after the internal timing signal has been deactivated. The access time of the memory device is thus reduced.

The internal timing signal can be for example the address transition detection (ATD) signal normally provided in memory devices.

The time necessary for the selection of a redundancy row can be made not to increase by making the selection path of the redundancy rows particularly fast, even at the expense of a slight increase in chip area. For example, redundancy row driver circuits can be provided having a greater driving strength than the matrix row driver circuits of the row address decoder; stronger driver circuits obviously occupy a larger chip area, but this is possible since the number of redundancy rows is generally smaller with respect to the number of matrix rows, a small number of such stronger driver circuits must be provided, and the impact on the overall chip area is limited.

BRIEF DESCRIPTION OF THE DRAWINGS

These and other features and advantages of the present invention will be made more evident by the following detailed description of a particular embodiment, described as a non-limiting example in the annexed drawings, wherein.

DETAILED DESCRIPTION

Figure 1:
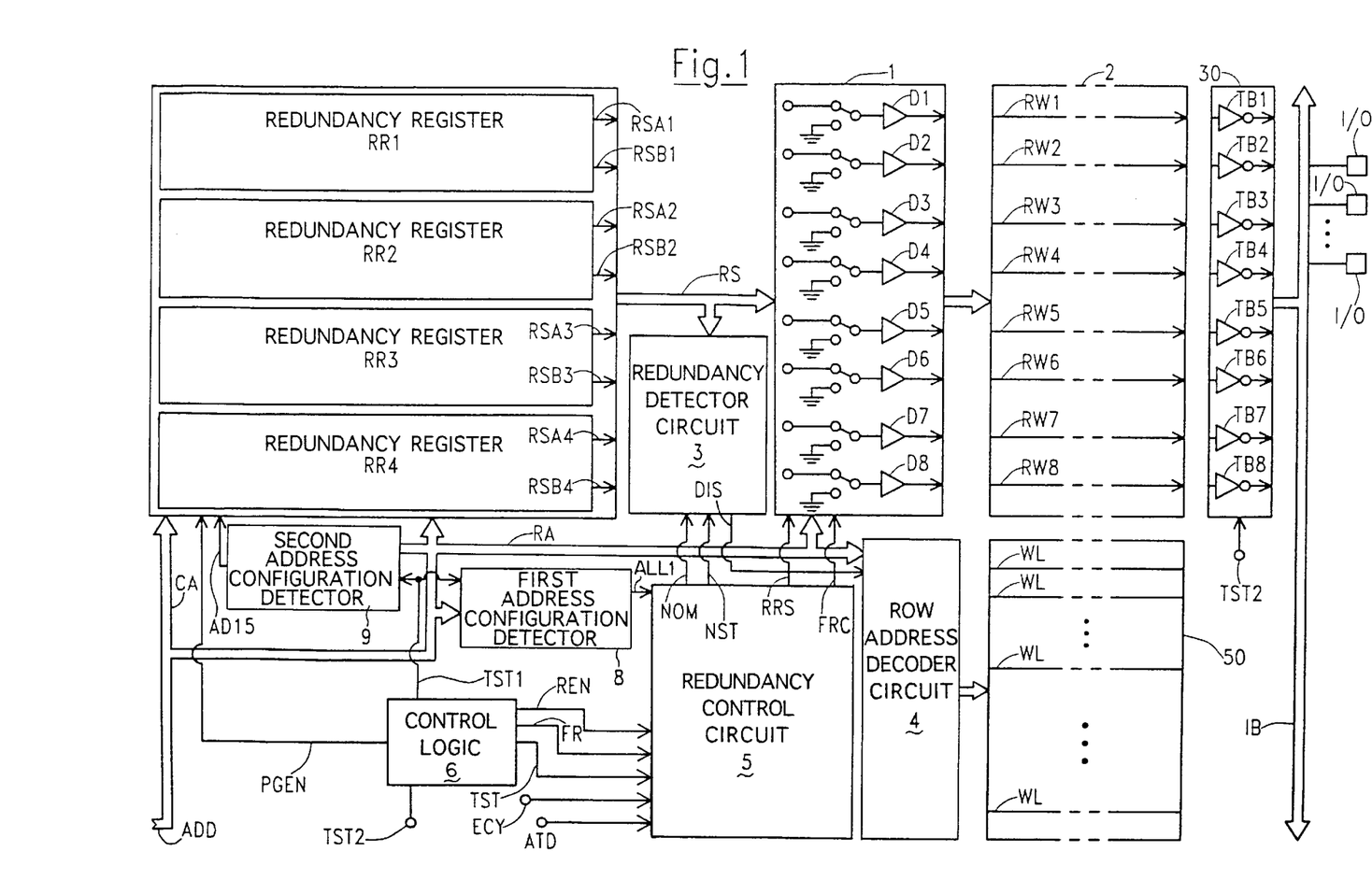
FIG. 1 is a schematic block diagram of a row redundancy circuit for a memory device according to the present invention.

With reference to FIG. 1, a row redundancy circuit according to the present invention is schematically shown. The row redundancy circuit is intended to be integrated in a semiconductor memory device to allow the functional substitution of redundancy word lines for defective word lines of a memory matrix.

The row redundancy circuit comprises a plurality (four in the shown example) of programmable non-volatile memory registers RR1–RR4 (redundancy registers) for storing addresses of defective matrix word lines (defective addresses). In the shown example, each redundancy register is capable of storing two defective addresses; however, this is not to be intended as a limitation of the present invention: more generally, the invention finds application also in row redundancy circuits comprising redundancy registers each one capable of storing a single defective address.

Each redundancy register controls the activation of two respective redundancy selection signals RSAi, RSBi (i= 1 . . . 4), either one or the other of which being activated when the current address supplied to the memory device coincides with one of the two defective addresses stored in the redundancy register.

The eight redundancy selection signals RSA1–4 and RSB1–4 supply (bus RS in FIG. 1) a buffer circuit 1 comprising eight redundancy word line drivers D1–D8, each driver driving a respective redundancy word line RW1–RW8 of a matrix 2 of redundancy memory cells.

The eight redundancy selection signals RSA1–4 and RSB1–4 also supply a redundancy detector circuit 3. When one of the eight redundancy selection signals RSA1–4, RSB1–4 is activated, the redundancy detector circuit 3 activates a disable signal DIS which disables a row address decoder circuit 4; the row address decoder circuit 4 is known per-se (and therefore not shown in detail) and is supplied by a bus of row address signals RA for decoding the current address supplied to the memory device and selecting a respective word line WL of a matrix 50 of memory cells. When the disable signal DIS is activated, the selection of the matrix word lines WL is inhibited. Selection of a matrix word line, as well as of a redundancy word line, means that the potential of the word line is driven to the high logic level (e.g., 5 V or 3 V). The decoder circuit 4 comprises a plurality of drivers, each one associated with a respective word line WL.

The redundancy detector circuit 3 is further supplied by two control signals NOM and NST generated by a redundancy control circuit 5. The redundancy control circuit 5 also supplies the buffer circuit 1 with two control signals RRS and FRC; the structure and operation of the redundancy control circuit 5 will be explained in detail later on.

The redundancy control circuit 5 is also supplied with three control signals REN, FR and TST generated by a control logic 6 provided in a per-se known way in the memory device to control the activation of several operation modes of the memory device (e.g., read mode, program mode, test modes, etc.). The redundancy control circuit 5 is also supplied by a first timing signal ATD and a second timing signal ECY generated internally in the memory device to provide an internal timing for the memory device.

The row redundancy circuit comprises a first address configuration detector circuit 8, supplied with the row address signals RA, capable of detecting if the current configuration of the row address signals corresponds to the configuration stored in non-programmed (virgin) redundancy registers RR1–RR4 (i.e., the configuration stored in redundancy registers which are not utilized because the number of defective word lines in the memory matrix is less than the number of redundancy word lines); circuit 8 supplies the redundancy control circuit 5 with a disable signal ALL 1.

The row redundancy circuit also comprises a second address configuration detector circuit 9 supplied by a sub-set RA0–RA3 of the row address signals RA for detecting a particular configuration of said sub-set of row address signals RA0–RA3, and for accordingly activating a control signal AD15 supplied to the redundancy registers RR1–RR4.

Circuits 8 and 9 are further supplied by a test signal TST1 generated by the control logic 6.

Also schematically shown in FIG. 1 is a group 30 of tri-state buffers TB1–TB8 controlled by a test signal TST2 generated by the control logic 6. Test signal TST2 is activated in a particular test mode to selectively connect the redundancy word lines RW1–RW8 to an internal bus IB comprising signals driving output terminals I/O of the memory device. This is useful during the in-factory testing of the memory device for detecting, directly at the output terminals of the memory device, which of the redundancy word lines are used to functionally replace defective word lines.

Figure 2:
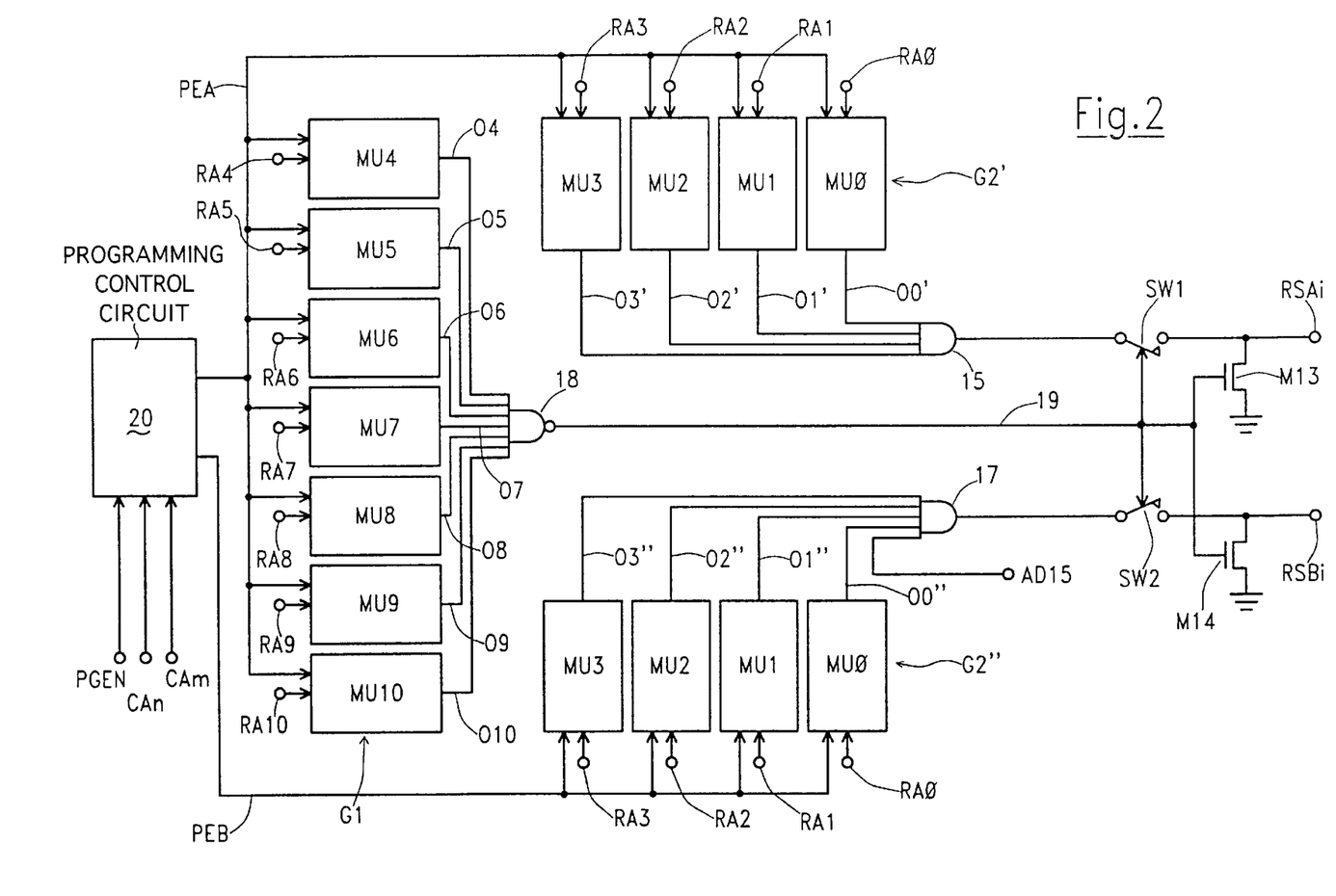
FIG. 2 is a circuit diagram of a redundancy register of the row redundancy circuit of FIG. 1.

FIG. 2 is a schematic diagram of one of the redundancy registers RR1–RR4. The redundancy register comprises three groups G1, G2' and G2" of memory units; a first group G1 comprises seven memory units MU4–MU 10, a second group G2' comprises four memory units MU0–MU3 and a third group G2" comprises four memory units MU0–MU3. Each one of the memory units MU4–MU10 in the first group G1 is supplied by a respective row address signal RA4–RA10; each one of the memory units MU0–MU3 in the second group G2' is supplied by a respective row address signal RA0–RA3; each one of the memory units MU0–MU3 in the third group G2" is supplied by a respective one of the row address signals RA0–RA3. In this example, signals RA0–RA3 represent the four least significant bits of the row address code, and signals RA4–RA10 represent the seven most significant bits of the row address code. Each memory unit comprises a programmable non-volatile memory element (such as, for example, a fuse or an EPROM memory cell) storing a respective bit of a defective address, and circuitry suitable for comparing the defective address bit stored therein with the respective bit of the current row address code supplied to the memory device. Each memory unit has a respective output signal O0'–O3',O0"–O3" and O4–O10 which is activated when the respective bit of the current row address code supplied to the memory device coincides with the defective address bit stored in the respective memory element. Output Signals O0'–O3' of the second group G2' of memory units are supplied to an AND gate 15 whose output supplies a first switch SW1. Output signals O0"–O3" of the third group G2" of memory units supply an AND gate 17 which is also supplied by the signal AD15 generated by circuit 9 in FIG. 1; the output of AND gate 17 supplies a second switch SW2. The output signals O4–O10 of the first group G1 of memory units supply a NAND gate 18 whose output signal 19 controls switches SW1 and SW2 to close when activated (low logic level). Signal 19 also controls the activation of two pull-down N-channel MOSFETs M13, M14 connected between a respective one of the two redundancy selection signals RSAi, RSBi (i=1 . . . 4) and ground: when signal 19 is deactivated (high logic level), switches SW1 and SW2 are open and MOSFETs M13 and M14 are on to pull signals RSAi and RSBi to ground, preventing them from remaining floating.

The redundancy register also comprises a programming control circuit 20 supplied by a program enable control signal PGEN, generated by the control logic 6, and by two respective column address signals CAm, CAn. Circuit 20 generates two programming signals PEA, PEB: signal PEA enables programming of the memory units of the first and second groups G1 and G2', signal PEB enables programming of the memory units of the third group G2". The column address signal CAm, when activated, enables programming of one particular redundancy register among the four available. Column address signal CAn allows to select which one of the two program enable signals PEA, PEB is to be activated.

Figure 3:
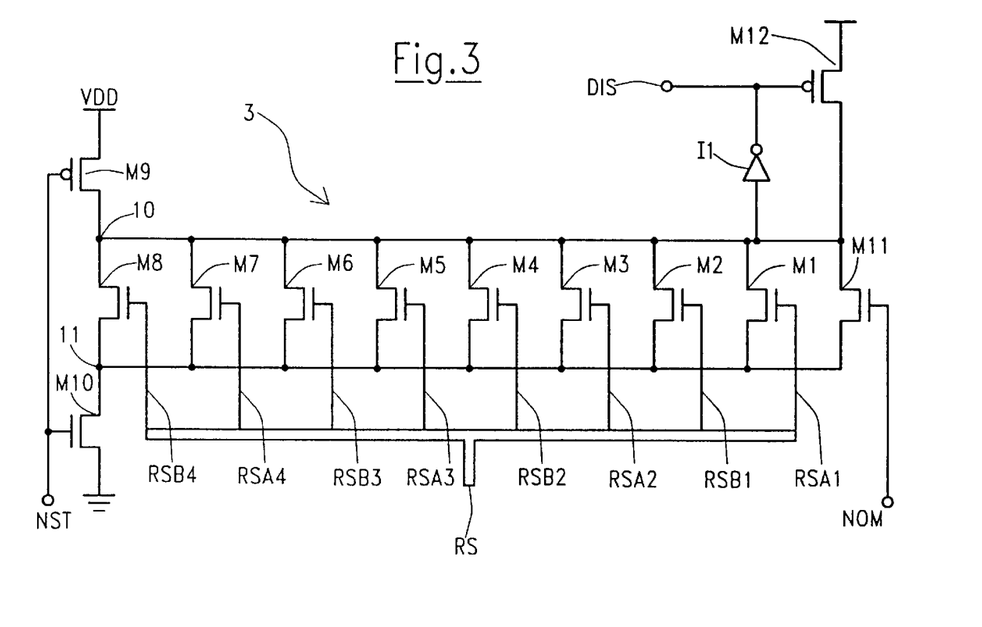
FIG. 3 is a diagram of a redundancy detector circuit of the row redundancy circuit of FIG. 1.

FIG. 3 is a diagram of the redundancy detector circuit 3. Each one of the eight redundancy selection signals RSA1–4, RSB 1–4 supplies a gate electrode of a respective N-channel MOSFET M1–M8. All the MOSFETs M1–M8 are connected in parallel to each other between a drain electrode 10 of a P-channel MOSFET M9 and a drain electrode 11 of an N-channel MOSFET M10; M9 has a source electrode connected to a voltage supply VDD, M10 has a source electrode connected to the ground reference voltage; M9 and M10 are controlled by the control signal NST generated by the redundancy control circuit 5. A further N-channel MOSFET M11, controlled by the control signal NOM also generated by the control circuit 5, is connected in parallel to MOSFETs M1–M8. The drain electrode 10 of M9 is supplied to an input of an inverter I1 whose output forms the disable signal DIS for the row address decoder 4. Inverter I1 also controls a P-channel MOSFET M12 connected between VDD and the drain electrode 10 of M9.

Figure 4:
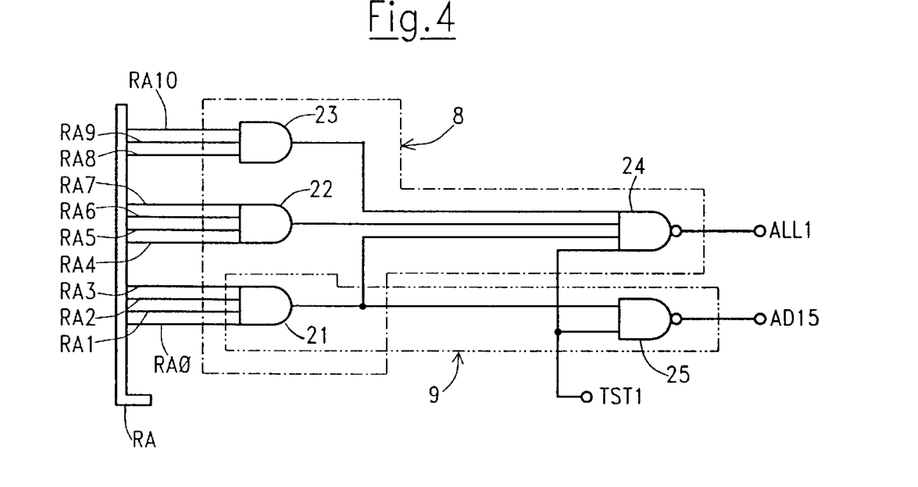
FIG. 4 is a diagram of a circuit for detecting particular configurations of address signals supplied to the memory device.

FIG. 4 is a diagram showing the first and second address configuration detector circuits 8 and 9 for the generation of signals ALL1 and AD15: signal ALL1 forms the output of a decoding circuit comprising three AND gates 21, 22 and 23 supplied with the row address signals RA0–RA3, RA4–RA7 and RA8–RA10, respectively, and a NAND gate 24 supplied with the outputs of AND gates 21, 22, 23 and with the test signal TST1 generated by the control logic 6. Signal AD15 forms the output of another decoding circuit comprising the AND gate 21 and a NAND gate 25 supplied with the output of AND gate 21 and with the test signal TST1. Signal ALL1 is activated (low logic level) when RA0= . . . =RA10="1"; signal AD15 is activated (low logic) when RA0= . . . =RA3="1". Activation of signal AD15 prevents the activation of redundancy word line selection signals RSB 1–4 (FIG. 2). Test signal TST1 is normally deactivated (high logic level), but it is activated in a particular test mode to prevent activation of signals ALL1 and AD15 independently of the address configuration.

Figure 5:
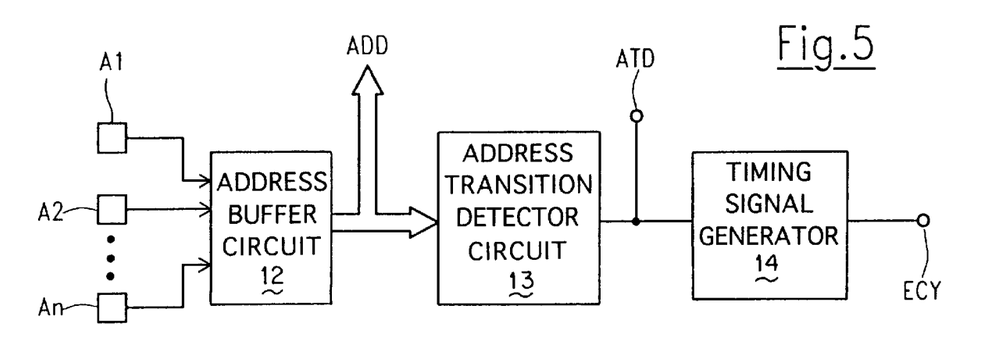
FIG. 5 is a schematic diagram of a circuit for generating internal timing signals for the memory device.
Figure 10:
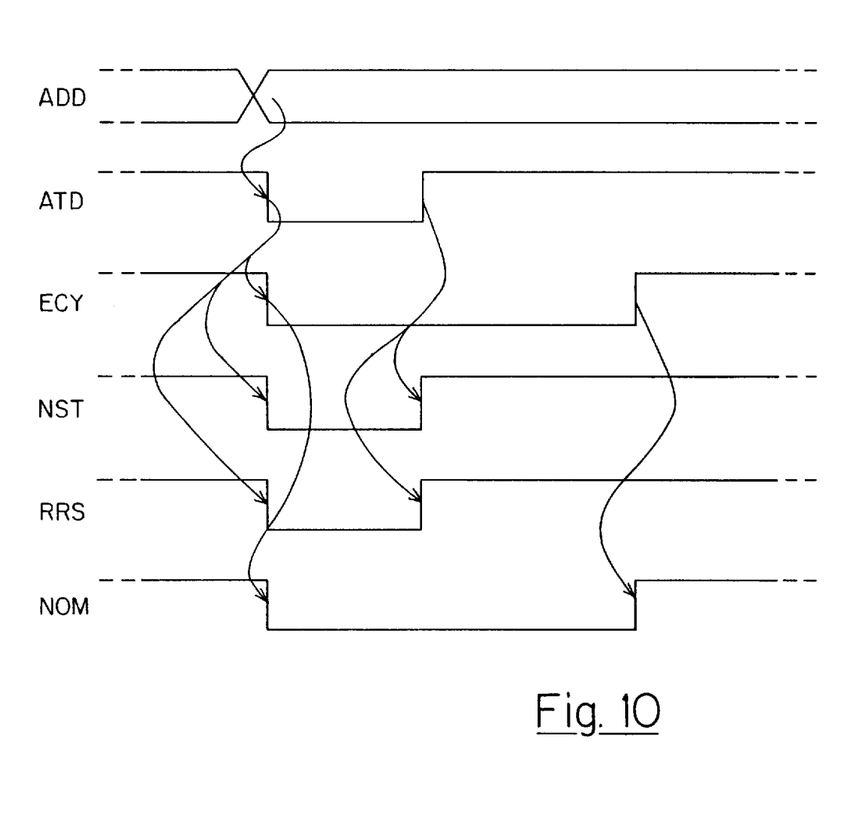
FIG. 10 is a timing diagram of some control signals of the row redundancy circuit of FIG. 1.

FIG. 5 is a schematic diagram showing the circuits for the generation of the first and second timing signals ATD and ECY. Signals supplied to address input terminals A1, A2 . . . . An of the memory device supply a per-se known address buffer circuit 12 which generates the address signals of the bus ADD. The address signals ADD are supplied to an address transition detector circuit 13 which, upon transition of at least one of the address signals ADD, activates the first timing signal ATD; signal ATD goes low and remains at the low logic level for a prescribed time, then it goes high again. Signal ATD supplies a circuit 14 which generates the second timing signal ECY; signal ECY is normally at the high logic level, and goes low when the ATD signal goes low; signal ECY remains low until the read operation has been completed, then it goes high again. Circuits 13 and 14 can be for example monostable circuits. FIG. 10 is a timing diagram showing the relationship between signals ADD, ATD and ECY.

Figure 6:
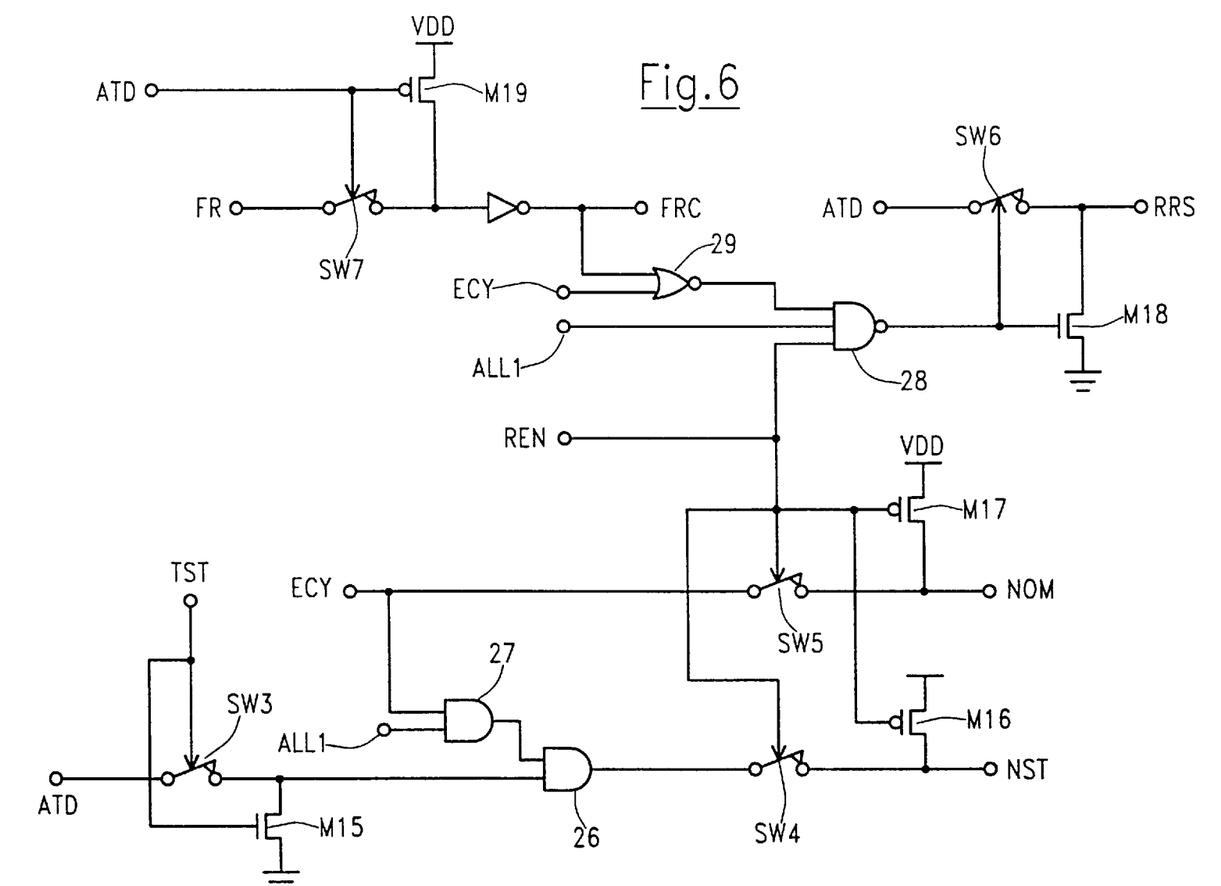
FIG. 6 is a diagram of a redundancy control circuit of the row redundancy circuit of FIG. 1.

FIG. 6 is a diagram of the redundancy control circuit 5 of FIG. 1. Control signals NOM and NST are generated as logic functions of the input control signals ATD, ECY and ALL1. Signal RRS is either equal to the signal ATD or it is forced to ground. Signal FRC is either equal to the logic complement of signal FR or it is forced to the voltage supply VDD.

More particularly, signal NST is the output of an AND gate 26 having a first input supplied by signal ATD and a second input supplied by the output of an OR gate 27 supplied by signals ALL1 and ECY. Signal ATD is allowed to supply AND gate 26 unless test signal TST is activated (high logic level): in the latter case, a switch SW3 coupling signal ATD to AND gate 26 is open, and an N-channel MOSFET M15 is activated to force the input of AND gate 26 to ground; also, the output of AND gate 26 is allowed to supply signal NST unless the redundancy enable signal REN is activated (low logic level): in the latter case, a switch SW4 is open and a P-channel MOSFET M16 is activated to force signal NST to VDD. Signal REN also controls the generation of signal NOM: in fact, when REN is activated, a switch SW5 is open and signal ECY cannot supply signal NOM; in this condition signal NOM is pulled to VDD by a P-channel MOSFET M17 activated by signal REN. Signal RRS is equal to signal ATD, unless a switch SW6 is open; switch SW6 is controlled by an output of a NAND gate 28 having a first input supplied by signal REN, a second input supplied by signal ALL1 and a third input supplied by an output of a NOR gate 29 supplied by signals ECY and FRC; when switch SW6 is open, signal RRS is forced to ground by an N-channel MOSFET M18. Finally, signal FRC is the output of a switch SW7 controlled by signal ATD: when ATD is activated (low), switch SW7 is open and signal FRC is forced to ground by a P-channel MOSFET M19 also controlled by signal ATD.

Figure 7:
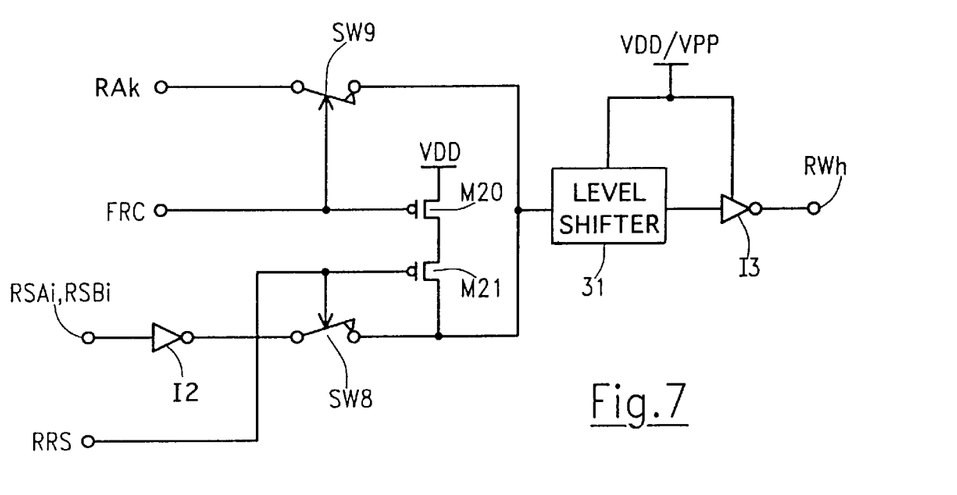
FIG. 7 is a diagram of a driver circuit for selecting a redundancy word line.

FIG. 7 is a circuit diagram showing one of the redundancy word line drivers D1–D8 of the buffer circuit 1. The circuit comprises an inverter 12 supplied by one of the eight redundancy selection signals RSAi, RSBi (i=1 . . . 4) and supplying, through a switch SW8, a level shifter 31; level shifter 31 is supplied by a supply voltage equal to VDD (5 V or less) when the memory device is operated in read mode, and equal to VPP (e.g. 12 V) when the memory device is operated in program mode. Level shifter 31 supplies a final inverter I3 also supplied by the supply voltage VDD/VPP and driving a respective redundancy word line RWh (h=1 . . . 8). Switch SW8 is controlled by signal RRS and is open when RRS is low. The input of level shifter 31 is also coupled, through a switch SW9, to a respective row address signal RAk (k=0 . . . 10); switch SW9 is closed when signal FRC is active (high). When both RRS and FRC are low, switches SW8 and SW9 are open; the input of level shifter 31 is pulled to VDD by two P-channel MOSFETs M20, M21 connected in series between the input of level shifter 31 and VDD. Preferably, final inverters I3 are realized to have a greater driving strength than the drivers in the row decoder circuit 4, so that the time needed to bring a redundancy word line to the high potential is less than the time needed to bring to the high potential a matrix word line.

Figure 8:
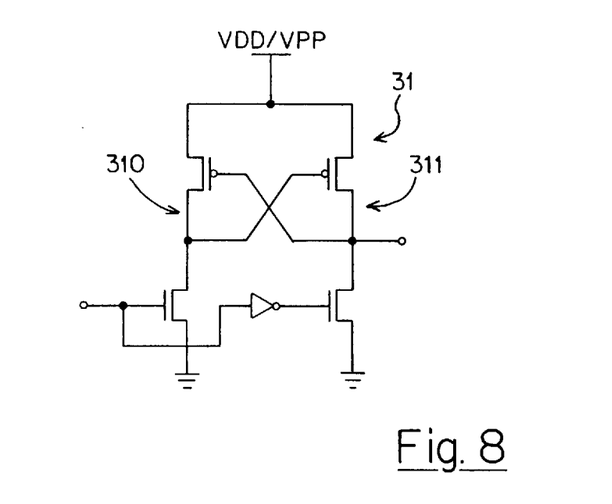
FIG. 8 is a diagram of a circuit block of the driver circuit shown in FIG. 7.

FIG. 8 shows the structure of the level shifter 31 of FIG. 7. The circuit comprises a cross-coupled structure having a first branch 310 and a second branch 311. The first branch 310 comprises a P-channel MOSFET and an N-channel MOSFET connected in series between the supply voltage VDD/VPP and ground. The second branch 311 comprises a P-channel MOSFET and an N-channel MOSFET connected in series between the supply voltage VDD/VPP and ground. The input of level shifter 31 forms a control signal for the N-channel MOSFET of the first branch and, after a logic inversion, for the N-channel MOSFET of the second branch. The gate electrodes of the P-channel MOSFETs in the first and second branch are respectively connected to the drain electrodes of the N-channel MOSFETs of the opposite branch. The output of the level shifter is connected to the drain electrode of the N-channel MOSFET in the second branch. Level shifter 31 is necessary because in program mode, when the voltage supply of the final inverter I3 is VPP (e.g., 12 V), a high logic level of 5 V or less at the input of final inverter I3 would cause a static current to flow in final inverter I3. Level shifter 31 raises the voltage at the input of inverter I3 to the VPP value. Level shifter 31, once set, does not drain current from the voltage supply VDD/VPP.

Figure 9:
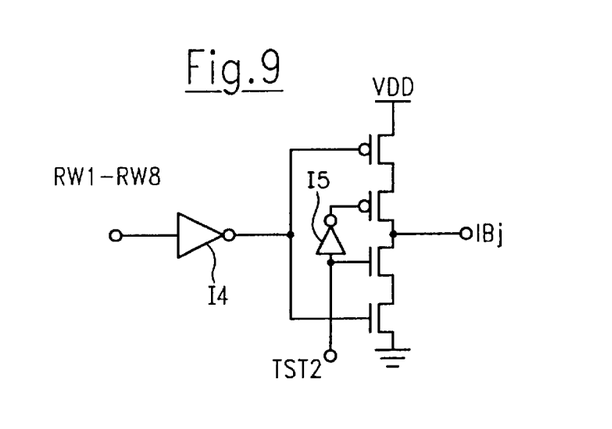
FIG. 9 is a diagram of a tri-state buffer for connecting a redundancy word line to an output terminal of the memory device.

Finally, FIG. 9 is a diagram showing one of the tri-state buffers TB1–TB8 of FIG. 1. The circuit comprises an inverter I4 supplied by a respective one of the eight redundancy word lines RW1–RW8. Inverter I4 controls a final tri-state inverter I5 which is activated by test signal TST2 and, when activated, drives a respective signal IBj of the internal bus IB of the memory device.

The operation of the row redundancy circuit previously described will be now explained.

During the in-factory testing of the memory device all the memory cells of the memory matrix are verified to detect the presence of defective memory cells.

The addresses of the matrix word lines containing defective memory cells are stored in the redundancy registers RR1–RR4. To program a redundancy register, the control logic activates the signal PGEN; by means of the column address signals CAm, CAn it is possible to select which one of the four redundancy registers RR1–RR4 is to be programmed and, inside the selected redundancy register, the groups of memory units wherein the defective address is to be programmed. When a redundancy register is programmed for the first time, signal PEA is activated and the defective address is programmed in the memory units of the groups G1 and G2': group G2' stores the four least significant bits RA0–RA3 of the defective address, while group G1 stores the seven most significant bits RA4–RA10 of the defective address. Group G2" can be used to store a second defective address, provided that said second defective address shares with the already programmed defective address the seven most significant bits RA4–RA10. In this way, the number of memory units necessary to store two defective addresses is reduced, with a great benefit in terms of chip area.

When the memory device is operated in normal read mode, every time an address signal (either a row address signal or a column address signal) changes, circuit 13 activates the normally-high signal ATD which goes low and remains low for a prescribed time (FIG. 10); signal ATD provides an internal timing signal for the memory device to perform the various phases of the read operation. Transition of signal ATD determines the activation of the normally-high signal ECY (FIG. 9), which goes low and remains low for a longer time than signal ATD; signal ECY returns to the high level when the read operation has been completed.

If the current address supplied to the memory device is not a defective address, row decoder circuit 4 decodes the current address and activates one of the word line drivers to select a word line WL of the matrix 50. Redundancy selection signals RSA1–4 and RSB 1–4 are all deactivated. As long as signal ATD is low, signals NST and RRS are also low; in the redundancy detector circuit 3 MOSFET M9 is on and MOSFET M10 is off, and node 10 is pulled to VDD; signal DIS is deactivated, so that the row address decoder 4 is enabled. All the redundancy word line drivers D1–D8 are also deactivated (switch 8 is open, and the output of inverter I3 is low). When signal ATD returns high, signals NST and RRS switch high; signal NST turns MOSFET M9 off and MOSFET M10 on; however, since signals RSA1–4 and RSB1–4 are all deactivated and signal NOM is still low, signal DIS is still deactivated; signal RRS activates the redundancy word line drivers D1–D8, but since the redundancy selection signals RSA1–4, RSB1–4 are deactivated, no redundancy word line will be activated. When at the end of the read cycle signal ECY returns high, signal NOM goes high activating MOSFET M11 in the redundancy detector circuit 3: node 10 is pulled to ground, and the disable signal DIS is activated, turning all the word line drivers in the row decoder circuit 4 off. Signal ECY also drives signal RRS low, so that the redundancy word line drivers D1–D8 are deactivated. In this way, at the end of the read cycle, both the matrix word line drivers in the row decoder 4 and the redundancy word line drivers D1–D8 are deactivated: this reduces the power consumption of the memory device and reduces the electric stress to which the memory cells and the redundancy memory cells are submitted.

It is now supposed that the current address supplied to the memory device is one of the defective addresses stored in the redundancy registers RR1–RR4. One of the redundancy selection signals RSAi, RSBi (i=1 . . . 4) will be activated as a result of the comparison of the current address with the address stored in the respective redundancy register: if for example the defective address is stored in groups G1 and G2' of redundancy register RR2, output signals O4–O10 and O0'–O3' will be activated, switch SW1 will be closed and signal RSA2 will be activated. In the row redundancy detector circuit 3, MOSFET M3 will be on; however, as long as signal ATD is low, signal NST is also low (FIG. 6), so that MOSFET M9 is on and MOSFET M10 is off: node 10 is therefor high and the disable signal DIS is low. In this condition, even if the current address is a defective address, row decoder 4 is not disabled and decodes the current defective address as if the latter is non-defective. Also, since all the redundancy word line drivers D1–D8 are deactivated by the signal RRS being low, no redundancy word line is selected. When after the prescribed time the signal ATD returns to the high level, signal NST switches high turning M9 off and M10 on: the input of inverter I1 is pulled to ground by M3, and the signal DIS is activated. Only at this time the row decoder 4 is deactivated, and the selection of the matrix word line is prevented. Simultaneously, the redundancy word line drivers D1–D8 are activated by signal RRS switching high: the redundancy selection signal RSA2 is supplied to the respective level shifter 31 and final inverter I3, carrying the potential of redundancy word line RW3 to VDD. At the end of the read cycle, signal ECY returns to the high level, causing switch SW6 in the redundancy control circuit 5 to open and determining the switching of signal RRS low: switch SW8 in the redundancy word line drivers D1–D8 opens and M21 turns on, so that all the redundancy word lines RW1–RW8 are deselected. Also in this case, at the end of the read cycle, both the matrix word lines WL and the redundancy word lines RW1–RW8 are all deselected, to reduce power consumption and memory cells stress.

Since at the beginning of each read cycle the row decoder circuit 4 is always enabled even if in the previous read cycle a defective address has been supplied, it is not necessary to wait for the redundancy registers RR1–RR4 to recognize that the current address is not a defective address, and for the redundancy detector circuit 3 to deactivate the disable signal DIS. The access time of the memory device is thus improved. The delay in the selection path of the redundancy word lines RW1–RW8 caused by the fact that activation of the redundancy word line drivers D1–D8 is enabled only at the end of signal ATD can be easily compensated by making the final inverters I3 of the redundancy word line drivers have a strong driving capability, i.e. by making their pull-up and pull-down transistors large in size; this has little effect in terms of chip area because the number of such final inverters is limited.

If the current address supplied to the memory device corresponds to the unprogrammed configuration of the memory elements of the memory units of the redundancy registers (which in this example has been assumed to be the configuration wherein RA0=RA1= . . . =RA10="1"), circuit 8 drives signal ALL1 low; in the redundancy control circuit 6, the output of NAND gate 28 is thus forced to the high level, SW6 is open and M18 is on, and signal RRS is forced to ground: this prevents the redundancy word lines from being activated. This is important to prevent that, when the address configuration RA0= . . . =RA10="1" is supplied to the memory device, the redundancy word lines associated to redundancy registers which have never been programmed are simultaneously selected.

Also, if the current address supplied to the memory device is such that RA0= . . . =RA3="1", circuit 9 activates signal ADI 5 which prevents the activation of all the redundancy selection signals RSB1–4: in this way, it is prevented that when such address configuration is supplied to the memory device the redundancy word lines associated with redundancy registers wherein the second group G2" of memory units has never been programmed are simultaneously selected. Obviously, this means that when a defective address has the four least significant bits equal to "1" s, such address must be stored in groups G1 and G2' of memory units of a selected redundancy memory register.

Signal TST is activated by the control logic 6 in a particular test mode to prevent the row decoder 4 from being disabled even when the address supplied to the memory device is a defective address: when signal TST is activated (high logic level), switch SW3 (FIG. 6) opens and M15 turns on forcing the input of NAND 26 low; signal NST is thus forced low independently of the state of signal ATD; signal DIS is therefore forced low even if one of the redundancy selection signals RSA1–4, RSB1–4 is activated.

Signal REN is activated by the control logic 6 in another particular test mode to forcedly disable row decoder 4: when signal REN is activated (low logic level), switches SW4 and SW5 in FIG. 6 are open, M16 and M17 are turned on, and signals NST and NOM are forced high; in the redundancy detector circuit 3 M9 is forced off, M10 on and M11 on, so that signal DIS is forced high, to deactivate the row decoder 4; also, activation of signal REN causes switch SW6 to open and M18 to turn on, forcing signal RRS low: all the redundancy word line drivers D1–D8 are thus deactivated.

Signal FR is another test signal activated by the control logic in another test mode to allow the selection of the redundancy word lines to be directly controlled by respective row address signals: when signal FR is activated (low logic level), as long as signal ATD is low signal FRC is forced to ground, but when ATD returns to the high logic level signal FRC goes high and switches SW9 in the redundancy word line drivers D1–D8 close; the high level of signal FRC forces the output of NAND gate 28 in the redundancy control circuit 5 to the high level, thus opening switch SW6 and turning MOSFET M18 on: signal RRS is thus forced to ground. In this way, in the redundancy word line drivers D1–D8 the selection of a given redundancy word line is made to depend on the logic level of a respective row address signal RAX (FIG. 7). Test signal FR can be activated in combination with signal REN.

Signal TST2 is a further test signal activated by the control logic 6 in a further test mode: when signal TST2 is activated, tri-state buffers TB1–TB8 are activated, connecting the redundancy word lines RW1–RW8 to the internal bus IB of the memory device and thus driving directly output terminals I/O of the memory device.

Even if in the present description a timing signal corresponding to the address transition detection signal ATD has been used to control the row redundancy circuit, this is not to be intended as a limitation of the present invention: more generally, the timing signal ATD could be any timing signal which is activated substantially at the beginning of a read cycle and which is deactivated after a prescribed time.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor memory device comprising:
   a matrix of memory cells comprising a plurality of rows of memory cells;
   first means for generating a first internal timing signal activated upon changing of a current address supplied to the memory device, the first timing signal remaining activated for a prescribed time starting from a beginning of a read cycle of the memory device;
   row address decoding means supplied with the current address for selecting a row of memory cells;
   second means for storing defective addresses of defective rows in said matrix of memory cells, for comparing said defective addresses with the current address supplied to the memory device, for selecting a redundancy row when the current address coincides with one of said defective addresses and for correspondingly deactivating the row address decoding means to prevent the selection of the defective row; and
   redundancy control means supplied with the first timing signal the redundancy control means enabling said row address decoding means at the beginning of the read cycle independently of the current address and maintaining the row address decoding means enabled until the first timing signal is deactivated, wherein the redundancy control means also prevents said second means from selecting a redundancy row at the beginning of the read cycle of the memory device until the first timing signal is deactivated independently of the current address supplied to the memory device, wherein said second means comprise:

at least one redundancy memory register for storing at least one respective address of a defective row of the matrix of memory cells, for comparing said defective address with the current address supplied to the memory device and for correspondingly activating a respective redundancy selection signal;

redundancy detector means supplied with the redundancy selection signal and for activating a disable signal for controlling the deactivation of the row address decoding means when the redundancy selection signal is activated the redundancy control means supplying the redundancy detector means with a first control signal for preventing the disable signal from being activated as long as the first timing signal is activated; and redundancy row selection means comprising a redundancy row driver supplied with the redundancy selection signal for selecting a respective redundancy row when the redundancy selection signal is activated. the redundancy control means supplying the redundancy row selection means with a second control signal for disabling the redundancy row driver as long as the first timing signal is activated, wherein said row address decoding means comprises a plurality of row drivers for selecting the rows of the matrix of memory cells, wherein said redundancy row driver has a greater driving force than the row drivers of the row address decoding means, whereby a time needed by the redundancy row driver to select the respective redundancy row is substantially less than a time needed by the row drivers to select a row of the matrix.

2. A semiconductor memory device, comprising:

a matrix of memory cells comprising a plurality of rows of memory cells;

first means for generating a first internal timing signal activated upon changing of a current address supplied to the memory device, the first timing signal remaining activated for a prescribed time starting from a beginning of a read cycle of the memory device;

row address decoding means supplied with the current address for selecting a row of memory cells;

second means for storing defective addresses of defective rows in said matrix of memory cells, for comparing said defective addresses with the current address supplied to the memory device, for selecting a redundancy row when the current address coincides with one of said defective addresses and for correspondingly deactivating the row address decoding means to prevent the selection of the defective row; and redundancy control means supplied with the first timing signal, the redundancy control means enabling said row address decoding means at the beginning of the read cycle independently of the current address and maintaining the row address decoding means enabled until the first timing signal is deactivated, wherein the redundancy control means also prevents said second means from selecting a redundancy row at the beginning of the read cycle of the memory device until the first timing signal is deactivated independently of the current address supplied to the memory device, wherein said second means comprise:

at least one redundancy memory register for storing at least one respective address of a defective row of the matrix of memory cells, for comparing said defective address with the current address supplied to the memory device and for correspondingly activating a respective redundancy selection signal;

redundancy detector means supplied with the redundancy selection signal and for activating a disable signal for controlling the deactivation of the row address decoding means when the redundancy selection signal is activated, the redundancy control means supplying the redundancy detector means with a first control signal for preventing the disable signal from being activated as long as the first timing signal is activated; and redundancy row selection means comprising a redundancy row driver supplied with the redundancy selection signal for selecting a respective redundancy row when the redundancy selection signal is activated, the redundancy control means supplying the redundancy row selection means with a second control signal for disabling the redundancy row driver as long as the first timing signal is activated, and third means for generating a second internal timing signal which is activated at the beginning of the read cycle, which remains activated substantially for the whole read cycle and is deactivated substantially at an end of the read cycle of the memory device, said second timing signal supplying the redundancy control means for determining, at the end of the read cycle, the activation of a third control signal supplied to the redundancy detector means activating the disable signal independently of the activation of the redundancy selection signal for disabling the row address decoding means, and deactivating the second control signal for disabling the redundancy row driver.

3. The semiconductor memory device according to claim 2, further comprising a plurality of redundancy memory registers each one storing at least one defective address, the respective redundancy selection signals being supplied to the redundancy detector means which activates the disable signal when one of the redundancy selection signals is activated, and supplying respective redundancy row drivers for selecting respective redundancy rows.

4. The semiconductor memory device according to claim 3, wherein each redundancy memory register is capable of storing two defective addresses having a common address part.

5. The semiconductor memory device according to claim 4, wherein each redundancy memory register comprises a first group of memory units each one storing a respective bit of said common part of the two defective addresses, a second group of memory units each one storing a respective bit of a remaining part of the first defective address, and a third group of memory units each one storing a respective bit of a remaining part of the second defective address, first logic circuit means for activating a first redundancy selection signal when the current address supplied to the memory device coincides with the first defective address and second logic circuit means for activating a second redundancy selection signal when the current address coincides with the second defective address.

6. The semiconductor memory device according to claim 5, further comprising first address configuration detector means for detecting when the current address supplied to the memory device coincides with a default address stored in unprogrammed redundancy memory registers, and for correspondingly activating a first redundancy disable signal supplied to the redundancy control means for preventing the activation of said disable signal.

7. The semiconductor memory device according to claim 6, further comprising second address configuration detector means for detecting when the current address supplied to the memory device coincides with a default configuration stored in the unprogrammed third group of memory units of the redundancy memory registers, and for correspondingly activating a second redundancy disable signal supplied to the redundancy memory registers for preventing the activation of the second redundancy selection signals.

8. The semiconductor memory device according to claim 3, further comprising an internal control logic controlling activation of a plurality of operation modes of the memory device.

9. The semiconductor memory device according to claim 8, wherein said operation modes comprise a first test mode in which a first test signal supplied by the control logic to the redundancy control means is activated to prevent the first control signal from being activated, thereby preventing the row address decoding means from being deactivated even when the current address supplied to the memory device is a defective address.

10. The semiconductor memory device according to claim 9, wherein said operation modes comprise a second test mode in which a second test signal supplied by the control logic to the redundancy control means is activated to force the activation of the first control signal and the third control signal to force the activation of the disable signal, and preventing the activation of the second control signal.

11. The semiconductor memory device according to claim 10, wherein said operation modes comprise a third test mode in which a third test signal is activated to switch a control input of the redundancy row drivers to be connected to a respective address signal line of the memory device.

12. The semiconductor memory device according to claim 11, further comprising a plurality of tri-state buffers each one activatable to connect a respective redundancy row to an internal bus of the memory device driving output terminals of the memory device, said operation modes comprising a fourth test mode in which a fourth test signal is activated to activate said tri-state buffers.

13. The semiconductor memory device according to claim 1, further comprising a plurality of redundancy memory registers each one storing at least one defective address, the respective redundancy selection signals being supplied to the redundancy detector means which activates the disable signal when one of the redundancy selection signals is activated, and supplying respective redundancy row drivers for selecting respective redundancy rows.

14. The semiconductor memory device according to claim 13, wherein each redundancy memory register is capable of storing two defective addresses having a common address part.

15. The semiconductor memory device according to claim 14, wherein each redundancy memory register comprises a first group of memory units each one storing a respective bit of said common part of the two defective addresses, a second group of memory units each one storing a respective bit of a remaining part of the first defective address, and a third group of memory units each one storing a respective bit of a remaining part of the second defective address, first logic circuit means for activating a first redundancy selection signal when the current address supplied to the memory device coincides with the first defective address and second logic circuit means for activating a second redundancy selection signal when the current address coincides with the second defective address.

16. The semiconductor memory device according to claim 15, further comprising first address configuration detector means for detecting when the current address supplied to the memory device coincides with a default address stored in unprogrammed redundancy memory registers, and for correspondingly activating a first redundancy disable signal supplied to the redundancy control means for preventing the activation of said disable signal.

17. The semiconductor memory device according to claim 16, further comprising second address configuration detector means for detecting when the current address supplied to the memory device coincides with a default configuration stored in the unprogrammed third group of memory units of the redundancy memory registers, and for correspondingly activating a second redundancy disable signal supplied to the redundancy memory registers for preventing the activation of the second redundancy selection signals.

18. The semiconductor memory device according to claim 13, further comprising an internal control logic controlling activation of a plurality of operation modes of the memory device.

19. The semiconductor memory device according to claim 18, wherein said operation modes comprise a first test mode in which a first test signal supplied by the control logic to the redundancy control means is activated to prevent the first control signal from being activated, thereby preventing the row address decoding means from being deactivated even when the current address supplied to the memory device is a defective address.

20. The semiconductor memory device according to claim 19, wherein said operation modes comprise a second test mode in which a second test signal supplied by the control logic to the redundancy control means is activated to force the activation of the first control signal and the third control signal to force the activation of the disable signal, and preventing the activation of the second control signal.

21. A memory device including a matrix of memory cells comprising a plurality of rows of memory cells, and a first timing signal of a predetermined duration activated upon a change of a current address supplied to the memory device, the memory device comprising:
  a row address decoding circuit including a plurality of row drivers to select a row of memory cells associated with the current address;
  a first circuit to store a defective address of a defective row in said memory device, to compare said defective address with the current address, to select a redundancy row when the current address coincides with said defective address, to activate a redundancy selection signal when the current address coincides with the defective address and to deactivate the row address decoding circuit so as to prevent selection of the defective row; and
  a redundancy control circuit supplied with the first timing signal to enable said row address decoding circuit upon an activation of the first timing signal until the first timing signal is deactivated and to prevent said first circuit from selecting a redundancy row until the first timing signal is deactivated,
  wherein the first circuit comprises a redundancy row selection circuit comprising a redundancy row driver supplied with the redundancy selection signal to select a redundancy row when the redundancy selection signal is activated, the redundancy control circuit to disable the redundancy row driver as long as the first timing signal is activated, and wherein said redundancy row driver has a greater driving force than the row drivers of the row address decoding circuit, whereby a time needed by the redundancy row driver to select the redundancy row is substantially less than a time needed by the row drivers to select a row of the matrix.

* * * * *

UNITED STATES PATENT AND TRADEMARK OFFICE
CERTIFICATE OF CORRECTION

PATENT NO. : 5,889,710
DATED : March 30, 1999
INVENTOR(S): Luigi Pascucci

It is certified that error appears in the above-identified patent and that said Letters Patent is hereby corrected as shown below:

Column 9, line 59 should read:

on forcing the input of AND gate 26 low; signal NST is thus

Column 10, line 20 should read:

row address signal Rak (FIG. 7.) Test signal FR can be

Signed and Sealed this

Tenth Day of August, 1999

Attest:

Q. TODD DICKINSON

Attesting Officer

Acting Commissioner of Patents and Trademarks